(12) United States Patent
Menczigar

(10) Patent No.: US 6,765,836 B2
(45) Date of Patent: Jul. 20, 2004

(54) SEMICONDUCTOR MEMORY WITH A CLOCK SYNCHRONIZATION DEVICE HAVING A TEMPERATURE CONTROLLED DELAY CIRCUIT

(75) Inventor: Ullrich Menczigar, Vaterstetten (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/659,693

(22) Filed: Sep. 10, 2003

(65) Prior Publication Data

US 2004/0057325 A1 Mar. 25, 2004

(51) Int. Cl.[7] .................................................. G11C 7/04
(52) U.S. Cl. ...................... 365/212; 365/211; 365/194; 365/233; 327/362; 327/378
(58) Field of Search ............................... 365/233, 211, 365/212, 194, 191; 327/362, 363, 378

(56) References Cited

U.S. PATENT DOCUMENTS

| 5,875,142 | A | | 2/1999 | Chevallier | 365/262 |
|---|---|---|---|---|---|
| 5,912,644 | A | * | 6/1999 | Wang | 342/457 |
| 6,278,309 | B1 | * | 8/2001 | Saeki | 327/261 |
| 6,438,067 | B2 | * | 8/2002 | Kuge et al. | 365/233 |
| 2002/0093855 | A1 | | 7/2002 | Heyne et al. | 365/194 |

* cited by examiner

Primary Examiner—Andrew Q. Tran
(74) Attorney, Agent, or Firm—Laurence A. Greenberg; Werner H. Stemer; Gregory L. Mayback

(57) ABSTRACT

In order to achieve an optimally stable synchronization of clock signals, a temperature-controlled delay device with which it is possible to generate a signal delay that is dependent on operating temperature is provided in a synchronization device for a semiconductor memory device. In this manner, the clock signal can be time-tuned in a particular reliable fashion.

16 Claims, 3 Drawing Sheets

SEMICONDUCTOR MEMORY WITH A CLOCK SYNCHRONIZATION DEVICE HAVING A TEMPERATURE CONTROLLED DELAY CIRCUIT

BACKGROUND OF THE INVENTION

Field of the Invention

The invention relates to a synchronization device for a semiconductor memory device, in particular a high-frequency semiconductor memory device or a DDR-RAM memory module. In the synchronization device an input clock signal of the semiconductor memory device can be generated or received and then time-modulated. The time-modulated clock signal can be outputted as an output clock signal and provided to the semiconductor memory device for processing.

In semiconductor memory devices, an operation is based on a clock signal that is externally supplied or internally generated. Memory contents in the semiconductor memory device are stored, read, or deleted according to the clock signal. Because semiconductor devices contain a number of storage units, and a plurality of semiconductor memory units are typically jointly utilized in a circuit configuration—particularly according to a common clock—the synchronicity of the respective clock signals relative to one another and to the outputted data must be taken into consideration for the operation and configuration of modern semiconductor devices, so that each write, read, or delete command can be allocated a corresponding item of data which appears at the semiconductor memory device at a specified time, for example.

These aspects are particularly important in high-frequency or high-cycle semiconductor memory devices and particularly double-data-rate semiconductor memory devices such as DDR-RAMs.

Hitherto, the synchronization requirements have been taken into account by the provision of a synchronization device wherein an input clock signal of the semiconductor memory device can be generated or received, the generated or received input clock signal is time-modulatable, and the time-modulated generated or received input clock signal can be outputted as an output clock signal and made available to the semiconductor memory device for processing.

However, it is problematic that the synchronization device must be tuned to the circuit environment. Hitherto, the tuning has been determined and set in the stationary operating state, i.e. for a specified and predetermined operating temperature of the semiconductor memory device or synchronization device. But when the operating temperature of the semiconductor memory device or synchronization device changes, deviations occur in the tuning of the synchronization behavior of the synchronization device relative to the stationary state. This is particularly disadvantageous for operating from a normal mode into an energy-saving mode, and particularly when moving from the energy-saving mode into the normal mode.

SUMMARY OF THE INVENTION

It is accordingly an object of the invention to provide a synchronization device for a semiconductor memory device that overcomes the above-mentioned disadvantages of the prior art devices of this general type, with which a clock signal can be time-tuned in a particularly reliable fashion.

With the foregoing and other objects in view there is provided, in accordance with the invention, a synchronization device for a semiconductor memory device. The synchronization device contains a temperature-controllable delay device for assisting in time modulating an input clock signal. The temperature-controllable delay device receives or generates the input clock signal. The temperature-controllable delay device further generates a signal delay dependent on an operating temperature of the semiconductor memory device. The temperature-controllable delay device outputs an output clock signal based on the input clock signal with a delay equal to the signal delay.

The inventive synchronization device is characterized by the provision of a temperature-controllable or temperature-controlled delay device. Furthermore, a signal delay that is dependent on an operating temperature of the semiconductor memory device can be generated by the temperature-controllable or temperature-controlled delay device. Furthermore, the generated or received clock signal can be outputted by the temperature-controllable or temperature-controlled delay device as an output clock signal with a delay equal to the signal delay.

It is thus a core idea of the present invention to provide a delay device inside the synchronization device that is itself temperature-controllable or temperature-controlled. The temperature-controllable or temperature-controlled delay device generates a signal delay relative to the generated or received input clock signal that takes into account the temperature dependency. The signal delay that is generated according to the respective operating temperature of the semiconductor memory device is taken into consideration in that the generated and received input clock signal is released by the temperature-controlled or temperature-controllable delay device as an output clock signal with a delay equal to the generated signal delay.

The signal delay that is generated as a function of temperature is so selected and set, that the following relation for the input clock signal Cin and the output clock signal Cout can be satisfied, or at least approximately so:

$$\text{Cout}(t) = \text{Cin}(t - \Delta t(\theta)).$$

Here, t is time, $\Delta t$ is the signal delay relative to the input clock signals Cin and the output clock signals Cout, and $\theta$ is the temperature.

According to the present invention, the temperature-dependent signal delay $\Delta t(\theta)$ can be generated by the temperature-controlled or temperature-controllable delay device in such a way that the output clock signal Cout or its time characteristic is substantially independent of an operating temperature of the semiconductor memory device.

All the temperature dependencies of the individual portions of particular assemblies that occur in the synchronization device and the semiconductor memory device are taken into account in the overall delay, and the temperature-dependent signal delay $\Delta t(\theta)$ that is generated by the temperature-controlled or temperature-controllable delay device is adapted so that a signal delay that is constant across all temperatures emerges between the input signal Cin and the output signal Cout for all operating temperatures as a whole for the entire synchronization device and/or for the entire semiconductor memory device including the synchronization device.

In particular, it is provided that a first signal delay $\Delta t(\theta 1)$ and a second signal delay $\Delta t(\theta t2)$ can be generated for each first operating temperature $\theta 1$ and each second operating temperature $\theta 2$ of the semiconductor memory device, respectively, in such a way that the relation $$\text{Cout1}(t) = \text{Cout2}(t)$$

can be satisfied, or at least approximately so, by the respective output clock signals Cout1 and Cout2 at all times t, provided that the relation $$Cin1(t)=Cin2(t)$$

is satisfied by the input signals Cin1 and Cin2, or at least approximately so, at all times t.

What this ultimately results in is that the overall delay between the input clock signal Cin and the output clock signal Cout remains constant, regardless of the operating temperature θ, because the temperature-dependent "additional delay" Δt(θ) is increased or decreased accordingly.

In particular, it is provided that a relatively shorter signal delay Δt(θ) is generated given a relatively higher operating temperature θ of the semiconductor memory device.

Alternatively or in addition, it is provided that a relatively long signal delay Δt(θ) can be generated given a relatively low operating temperature θ of the semiconductor memory device.

It is provided for purposes of performing the temperature-dependent controlling of the signal delay Δt that a temperature signal T that is representative of the respective operating temperature θ of the semiconductor memory device is or can be utilized, particularly in the form of what is known as a control voltage Vcntrl.

The temperature signal T is advantageously suppliable, namely from outside, by a control line that is provided. It is further provided that the temperature signal T can be generated and supplied by a temperature sensor device that is provided.

The temperature sensor is or can be connected to a control line device.

According to a particularly advantageous embodiment of the inventive synchronization device, it is provided that the synchronization device contains a delay line with an input terminal, an output terminal, and a control terminal.

Alternatively or additionally, it is provided that the delay device is disposed with an input terminal and an output terminal in the output terminal of the delay device.

In another alternative of the invention, it is provided that a feedback device with an input terminal and an output terminal is provided. In addition, a phase detector with first and second input terminals and an output terminal is provided.

It is particularly preferable when the input terminal of the feedback device is connected to the output terminal of the delay device in the input terminal of the delay line, and the output terminal of the feedback device is connected to the first input terminal of the phase detector device.

Furthermore, it can be provided that the second input terminal of the phase detector is connected to the input terminal of the delay line, and the output terminal of the phase detector is connected to the control terminal of the delay line.

It is particularly simple and advantageous when, according to another preferred embodiment of the present invention, the delay device contains two in-series tri-state inverters.

According to another aspect of the invention, a semiconductor memory device is provided in which a synchronization device is provided for time-modulating a clock signal, and the synchronization device is configured according to the invention.

These and other aspects of the invention also derive from the following description.

In double-data-rate DRAMS (DDR-RAMs), the data that are read are synchronized with an external clock edge. The phase difference between the external clock signal and the data that are read is thus minimized. The synchronization is performed with the aid of what are known as delay locked loop circuits (DLL). At current-saving drive rates (power down modes), a number of circuit parts and the DLL are shut off. This lowers the temperature of the chip. At the end of the power down mode (power down exit), the phase relation between the external clock signal and the read data is no longer a good match, because the phase difference was minimized in the hot chip and is no longer exactly in tune in the cooler chip. The proposed solution measures the temperature on the chip and adjusts an additional delay element in order to minimize the phase difference following a power down exit.

Hitherto, either the DLL was driven in the power down mode, or an exacerbation of the phase difference following a power down exit was accepted as a trade-off.

The advantages related to the ability to shut off the DLL in the power down mode in order to save current, while nevertheless minimizing the phase difference at the same time.

The invention relates to synchronizing data DQ<0:n> with an external clock signal (CLK) with the aid of the DLL. The clock CLK is compared with the output of a feedback circuit (FB) in a phase detector. Inside the feedback circuit, the delay of the receiver (RCV) and the off-chip driver (OCD) is simulated. The delay of the delay line (DL) is adjusted until the phase difference at the input of the phase detector reaches zero.

The following relation exists at the phase detector:

$$t_{RCV}+t_{DL}+t_{VCDL}+t_{FB}=t_{RCV}+n\cdot t_{cyc}$$

where $t_{cyc}$ is the cycle time of the clock signal.
With $$t_{FB}=t_{RCV}+t_{OCD}$$

the same relation exists as the relation between the CLK input and the DQ output $$t_{RCV}+t_{DL}+t_{VCDL}+t_{OCD}=n\cdot t_{cyc}$$

CLK and DQ<0:n> are thus in phase for $$t_{DL}=n\cdot t_{cyc}-t_{OCD}-t_{RCV}-t_{VCDL}$$

$t_{DL}$ is constantly readjusted as long as the chip is not in a power down state in which the DLL is likewise off. In the power down state, the chip cools down and $t_{OCD}$, $T_{RCV}$ and $t_{DL}$ become shorter. A phase difference between CLK and DQ<0:15> should therefore emerge after the power down exit. The temperature is measured by a temperature sensor (e.g. a bandgap preference circuit that is implemented on each chip) and converted into a control voltage ($V_{ctrl}$), and the delay of the voltage controlled delay line VCDL is readjusted. The temperature drift of $t_{OCD}$, $t_{RCV}$ and $t_{DL}$ can be partly compensated by this. This makes it possible to completely shut down the DLL in the power down mode, because it is not necessary to readjust the delay line in the power down mode.

Other features which are considered as characteristic for the invention are set forth in the appended claims.

Although the invention is illustrated and described herein as embodied in a synchronization device for a semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
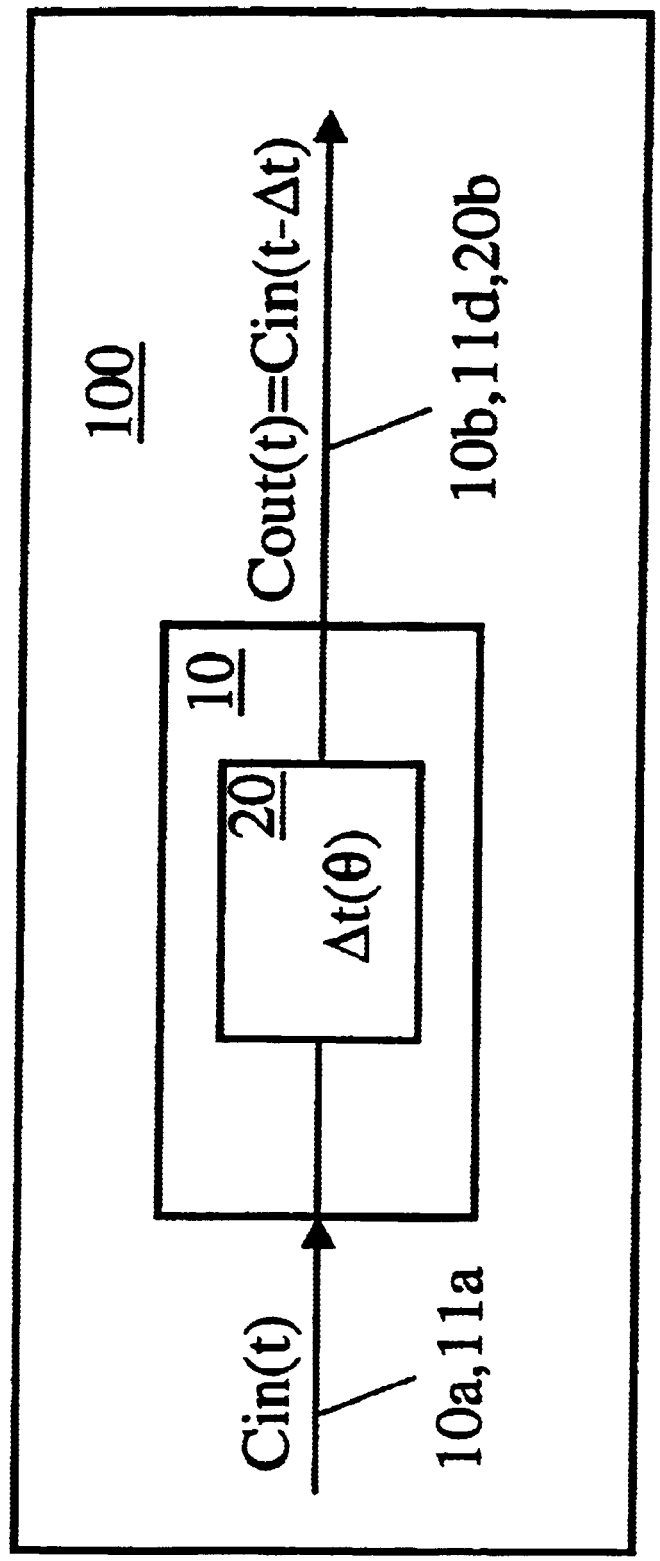
FIG. 1 is a block diagram representing the basic principle of a synchronization device according to the invention.

Identical or functionally identical elements and structures are assigned the same reference characters, without a complete explanation being given in each case. Referring now to the figures of the drawing in detail and first, particularly, to FIG. 1 thereof, there is shown a block diagram of the basic functioning of a synchronization device 10 in the area of a semiconductor memory device 100 or similar device, according to a preferred embodiment of the invention.

In a schematically represented semiconductor memory device 100, a time-dependent input clock signal Cin(t) is fed to the inventive synchronization device 10, which inventively contains a temperature-controlled delay device 20 and an input terminal 10a, 11a. Based on the function of the inventively provided temperature-controlled delay device 20, an output clock signal Cout(t) is then generated and outputted at the output terminal 10b, 11b of the inventive synchronization device 10. Based on the function of the inventive synchronization device 10 with the temperature-controlled delay device 20, for any two operating temperatures θ1 and θ2, the output signals Cout1 and Cout2 are identical and have an identical time characteristic, provided that the input clock signals Cin1 and Cin2 are likewise identical and coincident.

Accordingly, the following relation is at least approximately maintained for all times t:

$$Cin(t)=Cin2(t)\rightarrow Cout1(t)=Cout2(t).$$

Figure 2:
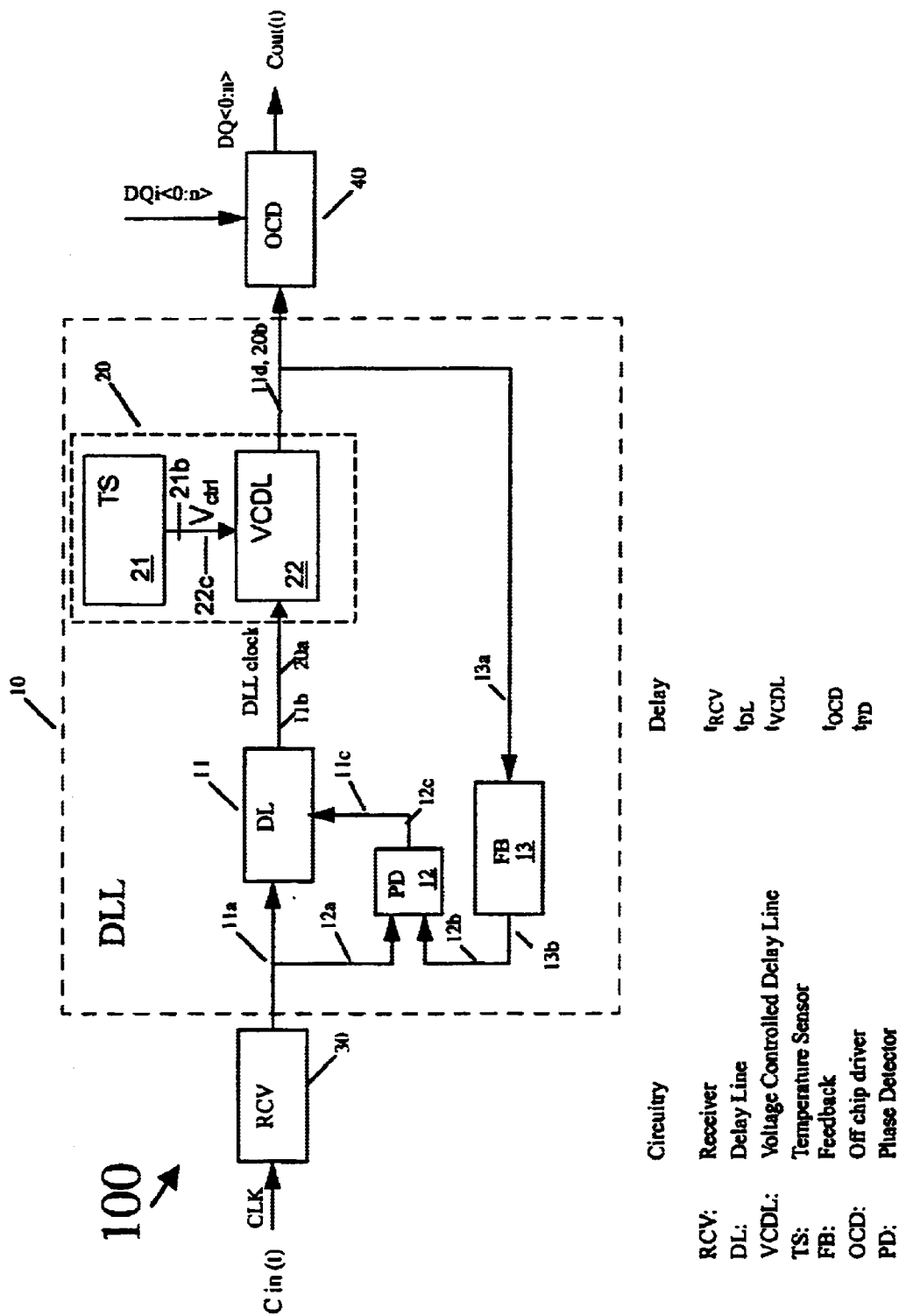
FIG. 2 is a block diagram representing an embodiment of the synchronization device in greater detail.

FIG. 2 is a block diagram representing the structure of an embodiment of the inventive synchronization device 10 in the area of the semiconductor memory device 100 in detail.

Across the input terminal 10a, 11a, the input clock signal Cin with a particular time curve, which is indicated by Cin=Cin(t), is fed to the inventive synchronization device 10, whereby a receiver circuit 30 that is provided in the input region generates a corresponding first delay component $t_{RCV}$. After passage through the inventive synchronization device 10, an output clock signal Cout=Cout(t), which is also time-dependent, emerges at the output. The signal then passes through a driver block, namely an off-chip driver OCD 40, that is provided in the output region, which likewise leaves behind a delay component $t_{OCD}$ in the signal curve.

A delay line 11 with its input terminal 11a and output terminal 11b are core parts of the inventive synchronization device 10. The delay line 11 is controlled by way of a control terminal 11c, namely by a provided feedback device 13 and a phase difference detector 12. The inventively provided temperature-controlled delay device 20 is inserted in series in the region of the output terminal 11b, namely with its input terminal 20a directly at the output terminal 11b of the delay line 11, so that an output terminal 20b of the delay device 20 forms the actual output terminal 11d or 10d of the line delay 11 and thus the synchronization device 10.

The input terminal 13a of the feedback circuit or feedback device 13 is connected directly to the output terminal 20b, 10b, 11d of the temperature-controlled delay device 20, the synchronization device 10, and the delay line 11. The output terminal 13b of the feedback device 13 is connected to a first input 12b of a phase dector 12. The second input 12a of the phase dector 12 is connected to the input terminal 10a, 11a of the synchronization device 10, or respectively, of the delay line 11. An output terminal 12c of the phase dector 12 is led directly to the control terminal 11c of the delay line 11.

In the embodiment represented in FIG. 2, the temperature-controlled delay device 20 itself possesses a temperature sensor 21 by which a control voltage Vcntrl is generated, which serves as a temperature signal T representing the operating temperature θ, and which is supplied across an output terminal 21b of the temperature sensor 21 to the control terminal 22c of a voltage-controlled delay circuit 22 that forms the actual core of the temperature-controlled delay circuit 20.

Figure 3:
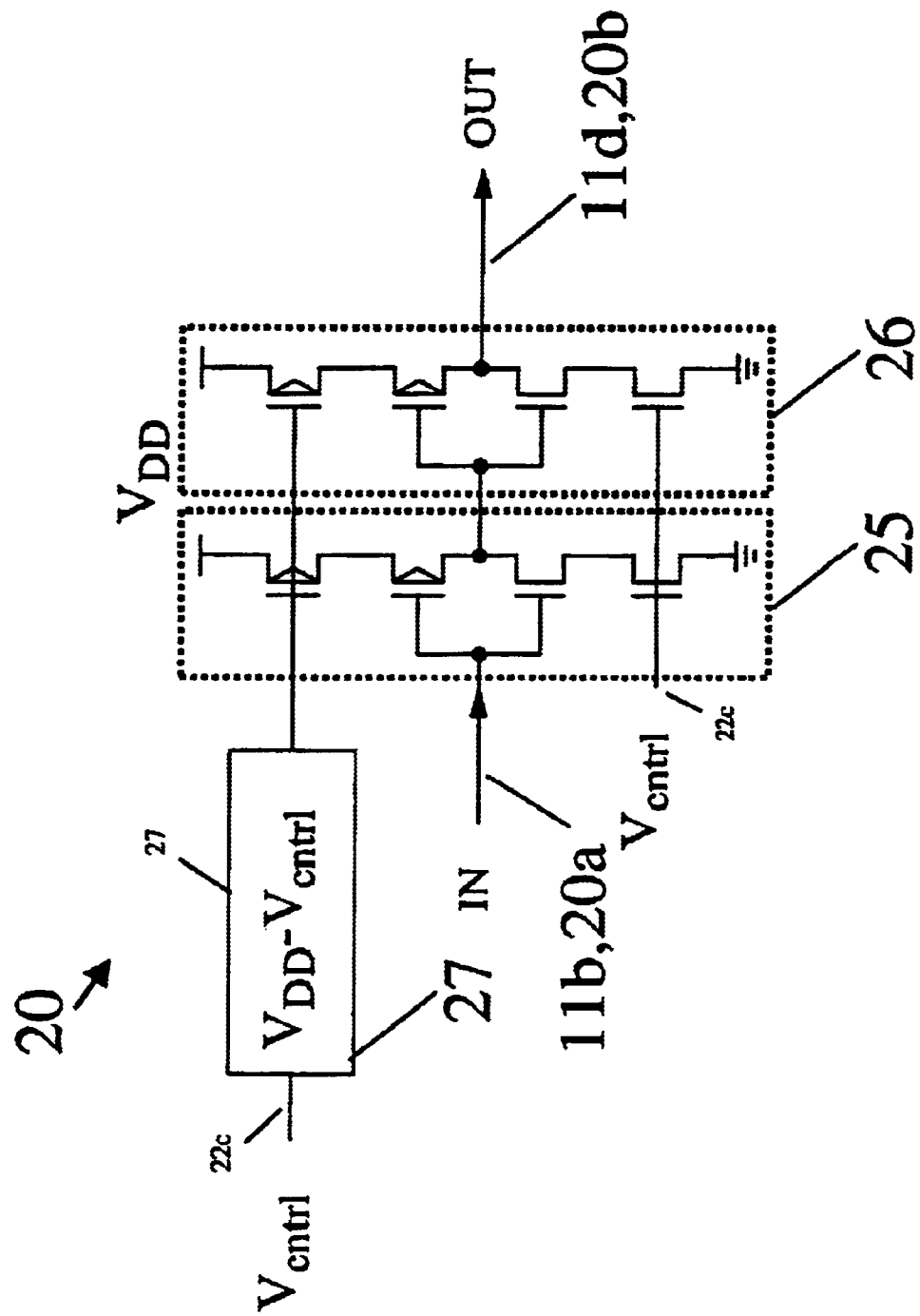
FIG. 3 is a circuit diagram representing an embodiment of a temperature-controlled delay device being applied in the invention.

FIG. 3 is a circuit diagram representing a possible advantageous construction of a voltage-controlled delay circuit 22 of such type as can be utilized in the temperature-controlled delay device 20. A control voltage Vcntrl representing the temperature θ is supplied across the control terminal 22c to the control gates of two in-series tri-state inverters 25 and 26, each of which is clamped to an operating potential $V_{DD}$. Also provided is a difference forming device 27, which forms a difference between the control voltage Vcntrl and the operating voltage $V_{DD}$.

As the temperature θ rises, i.e. as the temperature signal T, and with it the control voltage Vcntrl, grow, the output voltage at the difference forming device 27c drops, and a shorter delay Δt is generated, which makes a reduced contribution to the overall delay of the synchronization device 10. As the temperature drops, i.e. as the other components make smaller contributions to the delay, the temperature signal T for the corresponding operating temperature θ is also smaller, and consequently the control voltage Vcntrl is lower. Accordingly, a longer delay is generated by the configuration represented in FIG. 3, and consequently a constant delay can be set overall, independent of temperature.

I claim:

1. A synchronization device for a semiconductor memory device, comprising:

a temperature-controllable delay device for assisting in time modulating an input clock signal, said temperature-controllable delay device for one of receiving and generating the input clock signal, said temperature-controllable delay device further generating a signal delay dependent on an operating temperature of the semiconductor memory device, said temperature-controllable delay device outputting an output clock signal based on the input clock signal with a delay equal to the signal delay.

2. The synchronization device according to claim 1, wherein the signal delay can be generated satisfying a relationship:

$$Cout(t)=Cin(t-\Delta t(\theta))$$

for the input clock signal and the output clock signal, where Cin is the input clock signal, Cout is the output clock signal being a time-dependent output clock signal, t is time, $\Delta t$ is the signal delay, and $\theta$ is the operating temperature.

3. The synchronization device according to claim 1, wherein the signal delay dependent on the operating temperature is generated such that the output clock signal or a time characteristic of the output clock signal is substantially independent of the operating temperature of the semiconductor memory device.

4. The synchronization device according to claim 1, wherein said temperature-controllable delay device generates a first signal delay $\Delta t(\theta 1)$ and a second signal delay $\Delta t(\theta 2)$ for each first operating temperature $\theta 1$ and for each second operating temperature $\theta 2$ of the semiconductor memory device, respectively, such that a relationship $$Cout1(t)=Cout2(t)$$

is satisfied by output clock signals Cout1 and Cout2 for all times t, provided that $$Cin1(t)=Cin2(t)$$

is satisfied by respective input clock signals Cin1 and Cin2 for all the times t.

5. The synchronization device according to claim 1, wherein said temperature-controllable delay device generates a relatively shorter signal delay given a relatively higher operating temperature of the semiconductor memory device, and generates a relatively longer signal delay given a relatively lower operating temperature of the semiconductor memory device.

6. The synchronization device according to claim 1, wherein said temperature-controllable delay device uses a temperature signal representing the operating temperature of the semiconductor memory device for a temperature-dependent controlling of the signal delay.

7. The synchronization device according to claim 6, further comprising a control line over which the temperature signal is supplied.

8. The synchronization device according to claim 7, further comprising a temperature sensor generating the temperature signal and connected to said control line.

9. The synchronization device according to claim 1, further comprising a delay line with an input terminal, an output terminal, and a control terminal, said temperature-controllable delay device has an input terminal and an output terminal disposed in said output terminal of said delay line.

10. The synchronization device according to claim 9, further comprising:

a feedback device connected to said temperature-controllable delay device and having an input terminal and an output terminal; and a phase detector connected to said feedback device and having first and second input terminals and an output terminal.

11. The synchronization device according to claim 10, wherein said input terminal of said feedback device is connected to said output terminal of said temperature-controllable delay device in said output terminal of said delay line, said output terminal of said feedback device is connected to said first input terminal of said phase detector.

12. The synchronization device according to claim 10, wherein:

said second input terminal of said phase detector is connected to said input terminal of said delay line; and said output terminal of said phase detector is connected to said control terminal of said delay line.

13. The synchronization device according to claim 1, wherein said temperature-controllable delay device has two tri-state inverters that are connected in series.

14. The synchronization device according to claim 6, wherein the temperature signal is a control voltage.

15. The synchronization device according to claim 1, wherein the semiconductor memory device is selected from the group consisting of a high-frequency semiconductor memory device and a DDR-RAM memory module.

16. A semiconductor memory device, comprising:

a synchronization device for time-modulating a clock signal, said synchronization device including:

a temperature-controllable delay device for assisting in time modulating an input clock signal, said temperature-controllable delay device for one of receiving and generating the input clock signal, said temperature-controllable delay device further generating a signal delay dependent on an operating temperature of the semiconductor memory device, said temperature-controllable delay device outputting an output clock signal based on the input clock signal with a delay equal to the signal delay.

* * * * *

UNITED STATES PATENT AND TRADEMARK OFFICE
CERTIFICATE OF CORRECTION

PATENT NO. : 6,765,836 B2
DATED : July 20, 2004
INVENTOR(S) : Ullrich Menczigar

It is certified that error appears in the above-identified patent and that said Letters Patent is hereby corrected as shown below:

Title page,
Item [30], Foreign Application Priority Data, should read as follows:
-- Sep. 10, 2002   (DE)   ……….. 102 41 928 --

Signed and Sealed this

Sixteenth Day of November, 2004

JON W. DUDAS
*Director of the United States Patent and Trademark Office*